(12) United States Patent
Shriyan et al.

(10) Patent No.: US 10,340,114 B1
(45) Date of Patent: Jul. 2, 2019

(54) METHOD OF ELIMINATING THERMALLY INDUCED BEAM DRIFT IN AN ELECTRON BEAM SEPARATOR

(71) Applicant: KLA-TENCOR CORPORATION, Milpitas, CA (US)

(72) Inventors: Sameet K Shriyan, San Jose, CA (US); Oscar Florendo, Hollister, CA (US); Joseph Maurino, Milpitas, CA (US); Daniel Bui, Castro Valley, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/980,212

(22) Filed: May 15, 2018

Related U.S. Application Data

(60) Provisional application No. 62/619,698, filed on Jan. 19, 2018.

(51) Int. Cl.
*H01J 37/12* (2006.01)
*H01J 37/147* (2006.01)
*H01J 37/28* (2006.01)

(52) U.S. Cl.
CPC .......... *H01J 37/12* (2013.01); *H01J 37/1472* (2013.01); *H01J 37/28* (2013.01); *H01J 2237/1516* (2013.01)

(58) Field of Classification Search
USPC ...................................... 250/396 R, 396 ML
See application file for complete search history.

(56) References Cited

U.S. PATENT DOCUMENTS

| | | |
|---|---|---|
| 7,342,238 B2 | 3/2008 | Zywno et al. |
| 7,394,066 B2 | 7/2008 | Murakoshi et al. |
| 8,373,136 B2 | 2/2013 | Schoenecker et al. |
| 9,053,900 B2 | 6/2015 | Xinrong et al. |
| 9,355,818 B2 | 5/2016 | Petric |
| 2005/0045821 A1* | 3/2005 | Noji ..................... G01N 23/225 250/311 |
| 2007/0023689 A1 | 2/2007 | Iizuka et al. |
| 2009/0286685 A1 | 11/2009 | Kraemer et al. |
| 2011/0089332 A1 | 4/2011 | Ivan et al. |
| 2011/0139978 A1 | 6/2011 | Frosien |
| 2013/0112889 A1 | 5/2013 | Chen et al. |
| 2015/0144785 A1 | 5/2015 | Sears |
| 2016/0329189 A1 | 11/2016 | Sears et al. |
| 2017/0243717 A1 | 8/2017 | Kruit |

FOREIGN PATENT DOCUMENTS

KR 20150003248 A 1/2015

OTHER PUBLICATIONS

ISA/KR, International Search Report and Written Opinion for PCT/US2019/014100 May 8, 2019.

* cited by examiner

*Primary Examiner* — Kiet T Nguyen
(74) *Attorney, Agent, or Firm* — Hodgson Russ LLP

(57) ABSTRACT

These electron beam separator designs address thermally-induced beam drift in an electron-optical system. A heater coil wrapped around the beam separator unit can maintain constant power. Additional coils also can be wrapped around the beam separator in a bifilar manner, which can maintain constant power in the beam separator coils. Wien power can be determined, and then heater coil current can be determined.

13 Claims, 21 Drawing Sheets

METHOD OF ELIMINATING THERMALLY INDUCED BEAM DRIFT IN AN ELECTRON BEAM SEPARATOR

CROSS-REFERENCE TO RELATED APPLICATIONS

This application claims priority to the provisional patent application filed Jan. 19, 2018 and assigned U.S. App. No. 62/619,698, the disclosure of which is hereby incorporated by reference.

FIELD OF THE DISCLOSURE

This disclosure relates to devices that use a charged particle beam and, more particularly, to addressing thermally-induced drift in a device that uses a charged particle beam.

BACKGROUND OF THE DISCLOSURE

Evolution of the semiconductor manufacturing industry is placing ever greater demands on yield management and, in particular, on metrology and inspection systems. Critical dimensions continue to shrink. Economics is driving the industry to decrease the time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Semiconductor technologies have created a high demand inspection of specimens within the nanometer scale. Micrometer and nanometer scale inspection is often done with charged particle beams that are generated and focused in charged particle beam devices. Examples of charged particle beam devices are electron microscopes, electron beam pattern generators, ion microscopes, and ion beam pattern generators. Charged particle beams, in particular electron beams, can offer superior spatial resolution compared to photon beams due to their short wavelengths at comparable particle energy.

One such inspection technology includes electron beam based inspection systems. Electron beam imaging systems typically use an electron beam column to scan an electron beam across a region of a substrate surface to obtain image data. An example of an electron beam based inspection system is a scanning electron microscope (SEM). SEM systems may image a surface of a sample by scanning an electron beam over a surface of a sample and detecting secondary electrons emitted and/or scattered from the surface of the sample. Typical SEM systems include a Wien filter located within the electron-optical column of the SEM and positioned above the sample for the purposes of deflecting the secondary electrons to a secondary electron detector. The utilization of such a Wien filter may cause transverse chromatic aberration in the primary beam.

These electron beam based inspection systems, including SEMs, are becoming increasingly relied upon for inspection of devices formed in semiconductor fabrication. Microscopes that utilize electron beams to examine devices may be used to detect defects and investigate feature sizes as small as, for example, a few nanometers. Therefore, tools that utilize electron beams to inspect semiconductor devices are increasingly becoming relied upon in semiconductor fabrication processes.

The SEM generates a primary electron (PE) beam illuminating or scanning a specimen. The primary electron beam generates particles like secondary electrons (SE) and/or backscattered electrons (BSE) that can be used to image and analyze the specimen. Many instruments use either electrostatic or compound electric-magnetic lenses to focus the primary electron beam onto the specimen. In some cases, the electrostatic field of the lens simultaneously collects the generated particles (SE and BSE) that enter into the lens and are guided onto a detector. If uniform high efficiency electron collection and detection is required, the secondary and/or backscattered particles must be separated from the primary beam. In such a case, the detection configuration can be designed completely independent from the PE optics design. If uniform high efficiency electron collection and detection is required, the secondary and/or backscattered particles must be separated from the primary beam, such as using a beam separator including magnetic deflection fields or a Wien filter element.

The SEM can include a beam separator having one or more electrostatic deflectors for deflecting a beam of primary electrons away from an optical axis normal to the substrate, or for redirecting a deflected beam into the optical axis. Electrostatic deflectors apply a voltage to multiple electrodes, thereby generating an electric field for deflecting the beam. For example, a symmetric quadrupole may be used, in which four electrode plates are spaced 90 degrees apart for deflection of the beam in either an X-direction or a Y-direction. For example, voltages $+V_x$ and $-V_x$ can be applied to the first and third electrodes respectively (the first and third plates opposed on the X-axis). Voltages $+V_y$ and $-V_y$ can be applied to the second and fourth electrodes respectively (the second and fourth plates opposed on the Y-axis).

The beam separator can introduce dispersion of the primary beam and can limit the attainable resolution. One type of Wien filter, an unbalanced type known as achromatic Wien filter can be used to avoid PE beam dispersion. However, these devices typically result in aberrations which can impair spot size and the spot resolution in inspection applications using large beam currents and beam diameters.

Thermally-induced beam drift also can occur. Previous techniques used a calibration scheme to detect drift in the electron beam. However, this calibration scheme needs constant beam position calibration, which makes it difficult to run long inspection or review jobs without drift compensation. This can cause negative effects on throughput.

Therefore, new techniques to address thermally-induced beam drift are needed.

BRIEF SUMMARY OF THE DISCLOSURE

In a first embodiment, an apparatus is provided. The apparatus includes an electron beam separator; a ceramic divider disposed on the electron beam separator; a set of electrostatic plates in an octupole arrangement disposed on the ceramic divider; a first separator coil pair disposed around the ceramic divider and arranged on opposite sides of the electron beam separator; a second separator coil pair disposed around the ceramic divider and arranged on opposite sides of the electron beam separator, orthogonal to the first separator coil pair; a heater coil disposed around the electron beam separator; and a power source configured to provide a heater coil current to the heater coil. The heater coil can be nichrome or copper, and may have a winding pitch from 8 to 10 turns per inch. In an example, the heater coil is a 24 gauge wire.

The apparatus can further include a processor. The processor can be configured to determine a Wien power based on a first equation.

$$P_{wien} = I_x^2 R_x + I_y^2 R_y$$

In this equation, $P_{wien}$ is the Wien power, $I_x$ is the current of the first separator coil pair, $R_x$ is the resistance of the first separator coil pair, $I_y$ is the current of the second separator coil pair, and $R_y$ is the resistance of the second separator coil pair. The processor also can be configured to determine the heater coil current based on a second equation.

$$I_{heater} = \sqrt{\frac{P - P_{wien}}{R_{heater}}}$$

In this equation, $I_{heater}$ is the heater coil current, P is the target power, $P_{wien}$ is the Wien power, and $R_{heater}$ is the resistance of the heater coil.

The heater coil current can create a magnetic field that causes a beam deflection, and the processor can be further configured to measure the beam deflection and calibrate the electron beam separator based on the beam deflection.

In a second embodiment, an apparatus is provided. The apparatus includes an electron beam separator; a ceramic divider disposed on the electron beam separator; a set of electrostatic plates in an octupole arrangement disposed on the ceramic divider; a first separator coil pair disposed around the ceramic divider and arranged on opposite sides of the electron beam separator; a second separator coil pair disposed around the ceramic divider and arranged on opposite sides of the electron beam separator, orthogonal to the first separator coil pair; and a power source configured to provide a heater coil current. The first separator coil pair and the second separator coil pair are bifilar, each comprising a separator coil and a heater coil. The heater coil current is provided to the heater coils of the first separator coil pair and the second separator coil pair. A curvature of the first separator coil and the second separator coil can be 120°.

The apparatus can further include a processor. The processor can be configured to determine a current provided by the power source.

In a third embodiment, a method of reducing thermal induced beam drift in an electron beam is provided. Using a processor, a wien power is determined using a first equation.

$$P_{wien} = I_x^2 R_x + I_y^2 R_y$$

$P_{wien}$ is the Wien power, $I_x$ is the current of the first separator coil pair, $R_x$ is the resistance of the first separator coil pair, $I_y$ is the current of the second separator coil pair, and $R_y$ is the resistance of the second separator coil pair.

Using the processor, a heater coil current is determined based on a second equation.

$$I_{heater} = \sqrt{\frac{P - P_{wien}}{R_{heater}}}$$

$I_{heater}$ is the heater coil current, P is the target power, $P_{wien}$ is the Wien power, and $R_{heater}$ is the resistance of the heater coil.

The heater coil current is provided to the heater coil via the power source.

The electron beam separator used with this method includes a ceramic divider disposed on an electron beam apparatus; a set of electrostatic plates in an octupole arrangement disposed on the ceramic divider; a first separator coil pair disposed around the ceramic divider and arranged on opposite sides of the electron beam separator; a second separator coil pair disposed around the ceramic divider and arranged on opposite sides of the electron beam separator, orthogonal to the first separator coil pair; a heater coil disposed around the electron beam separator; and a power source configured to provide a heater coil current.

The heater coil current can create a magnetic field that causes a beam deflection. The method can further include measuring the beam deflection using the processor and calibrating the electron beam separator using the processor based on the beam deflection.

Deflection correction can be determined. The deflection correction determination can include determining heater coil current based on a constant power equation; applying the heater coil current; measuring beam deflection; determining a zero deflection condition slope; and adjusting a coil current to the electron beam separator based on the zero deflection condition slope.

DESCRIPTION OF THE DRAWINGS

For a fuller understanding of the nature and objects of the disclosure, reference should be made to the following detailed description taken in conjunction with the accompanying drawings, in which:

FIG. 10 is a chart showing pixel shift over time for the first embodiment of the electron beam separator with the high current on;

FIG. 11 shows a chart of the Wien temperature and Wien temperature statistics for the first embodiment of the electron beam separator with high current on;

FIG. 12 shows a chart of enclosure temperature and the enclosure temperature statistics for the first embodiment of the electron beam separator with high current on;

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein resolve thermally-induced beam drift in an electron-optical system that has a beam separator used. A heater coil wrapped around the beam separator unit can maintain constant power. Small magnetic field deflection can be compensated for without impacting constant power mode operation. Additional coils also can be wrapped around the beam separator in a bifilar manner, which can maintain constant power in the beam separator coils. Thermally-induced beam drift in an electron beam separator can be reduced or eliminated, which provides an inherently stable system. Any residual magnetic field based deflection can be calibrated out.

Figure 1:
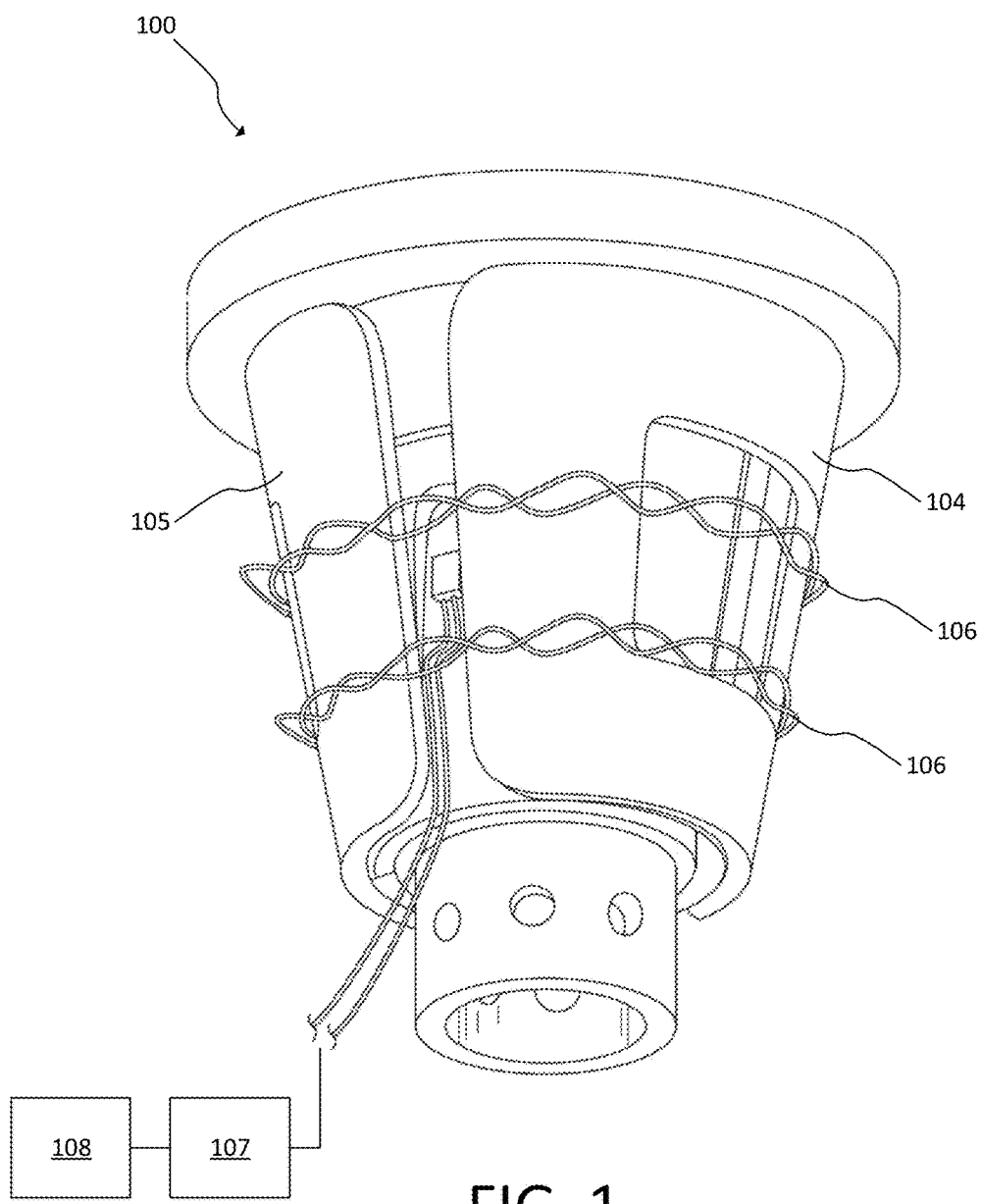
FIG. 1 is a perspective view of a first embodiment of an electron beam separator in accordance with the present disclosure.

FIG. 1 is a perspective view of a first embodiment of an electron beam separator 100. The electron beam separator 100 can separate the multiple electron signals emanating from the surface of a sample from the one or more primary electron beams. The electron beam separator 100 can have an electrostatic deflector (not illustrated). The electrostatic deflector can have an asymmetric quadrupole configuration or a symmetric quadrupole configuration. An asymmetric configuration generates a unidirectional deflection field and a symmetric configuration generates a bidirectional deflection field. In one embodiment, the asymmetric quadrupole electrostatic deflector deflects a secondary electron beam separated from the optical axis of electron beam device (i.e., the primary electron beam) by electron beam separator 100. In one embodiment, the asymmetric quadrupole electrostatic deflector of electron beam separator 100 deflects the separated secondary electron beam into a detector array.

Figure 2:
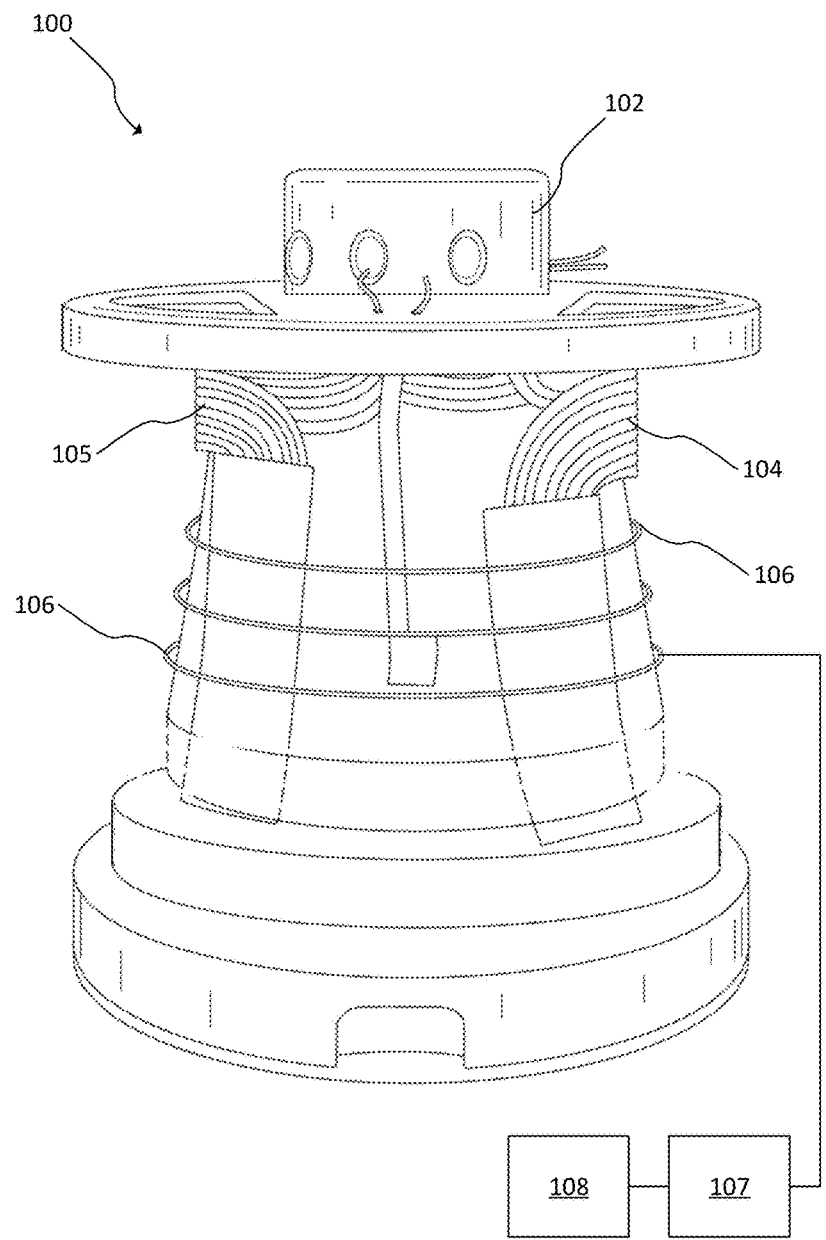
FIG. 2 is another perspective view of the first embodiment of an electron beam separator in accordance with the present disclosure.

The electron beam separator 100 includes at least one ceramic divider 102 (illustrated in FIG. 2). The ceramic divider 102 is disposed on the electron beam separator 100.

A set of electrostatic plates (which can be seen in the embodiment of FIG. 3) in the center of the electron beam separator 100 in an octupole arrangement are disposed on the ceramic divider 102. The ceramic divider 102 can hold the electrostatic plates in place.

A first separator coil pair 104 is disposed around the ceramic divider 102 and arranged on opposite sides of the electron beam separator 100. In an instance, the first separator coil pair 104 is wrapped around the ceramic divider 102. For example, the first separator coil pair 104 can be bent and wrapped in a desired position.

A second separator coil pair 105 is disposed around the ceramic divider 102 and arranged on opposite sides of the electron beam separator 100. The second separator coil pair 105 may be orthogonal to the first separator coil pair 104. In an instance, the second separator coil pair 105 is wrapped around the ceramic divider 102. For example, the second separator coil pair 105 can be bent and wrapped in a desired position.

A heater coil 106 is disposed around the electron beam separator 100. In an instance, the heater coil 106 is wrapped around the electron beam separator 100. The exact position of the heater coil 106 relative to the electron beam separator 100 and the number of loops can vary from that illustrated.

A single heater coil 106 is illustrated in FIG. 1 wrapping around the electron beam separator 100. In another instance, two or more heater coils 106 may be used.

The heater coil 106 can provide thermal stability for the electron beam separator 100. For example, the current flowing through the heater coils 106 can be controlled such that the whole electron beam separator 100 maintains a temperature during operation within a certain tolerance. For example, this tolerance may be ±1° C. or may be ±0.25° C.

The winding pitch of the heater coil 106 can reduce deflection. In an instance, the winding pitch is from 8 to 10 turns per inch. However, the winding pitch can be from 1 to 20 turns per inch or other values.

In an example, the heater coil 106 are made of a 24 gauge nichrome wire. In another example, the heater coil 106 is a copper wire. Other materials or gauges for the heater coil 106 are possible. The gauge can be determined based on the necessary voltage, current, or temperature effects. Thus, the gauge can be from, for example, 12 to 30 gauge, though other gauges are possible.

A power source 107 is configured to provide a heater coil current to the heater coil 106. The power source 107 can be configured to provide a desired output ±0.6 A.

A processor 108 also can be included. The processor 108 can be configured to determine a Wien power based on Equation 1.

$$P_{wien} = I_x^2 R_x + I_y^2 R_y \quad \text{Equation 1}$$

In Equation 1, $P_{wien}$ is the Wien power, $I_x$ is the current of the first separator coil pair 104, $R_x$ is the resistance of the first separator coil pair 104, $I_y$ is the current of the second separator coil pair 105, and $R_y$ is the resistance of the second separator coil pair 105.

The processor 108 also can be configured to determine the heater coil current for the heater coil 106 based on Equation 2.

$$I_{heater} = \sqrt{\frac{P - P_{wien}}{R_{heater}}} \qquad \text{Equation 2}$$

In Equation 2, $I_{heater}$ is the heater coil current, P is the target power, $P_{wien}$ is the Wien power, and $R_{heater}$ is the resistance of the heater coil 106.

The heater coil current in the heater coil 106 can create a magnetic field that causes a beam deflection. The processor can be further configured to measure the beam deflection and calibrate the electron beam separator 100 based on the beam deflection. In an instance, the electron beam separator 100 can be set to optimal. The heater coil current is determined based on a constant power equation. This determined heater coil current is applied, and beam deflection is measured. Separator coil is plotted against heater coil, and the zero deflection condition slope is determined. Coil current to the electron beam separator 100 is then adjusted based on the slope in an appropriate direction.

Note that the largest operating power for the coils, P, may be equal to a sum of $P_{wien}$ and $P_{heater}$.

$R_x$ may be equal to $R_y$, which is 1 ohm in an example. $R_{heater}$ is 30 ohm in an example. $I_{heater}$ is the determined heater coil current, which is shown in FIG. 6.

Figure 13:
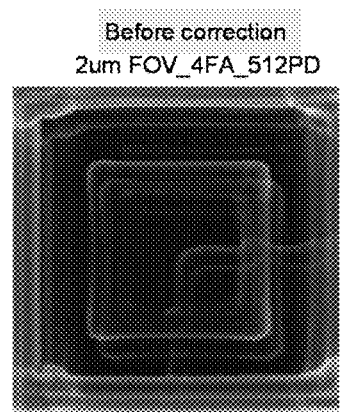
FIG. 13 shows thermally-induced drift prior to correction.
Figure 14:
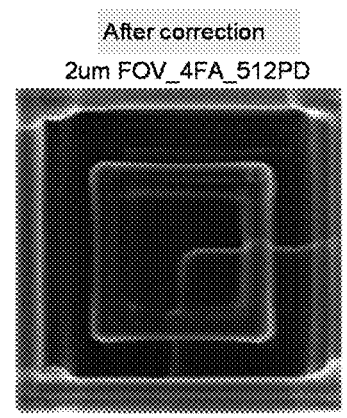
FIG. 14 shows thermally-induced drift correction.
Figure 15:
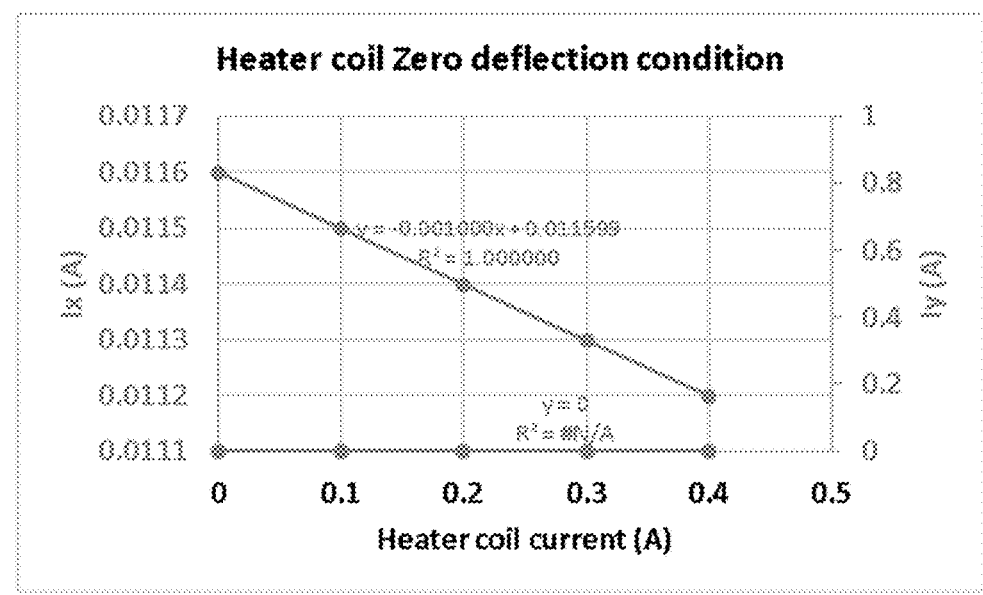
FIG. 15 is a chart of heater coil zero deflection condition.

The heater coil 106 can be wound in a twisted par fashion to minimize any beam deflection due to the magnetic field. The small residual magnetic field may cause a small amount of deflection, but can be calibrated out with minimal impact on constant power operation or temperature. The method of such compensation is shown in FIGS. 13-15 and impact on constant power shown in FIGS. 16-18.

FIG. 2 is another perspective view of the electron beam separator 100. A single heater coil 106 wrapped around the electron beam separator 100 is illustrated in FIG. 2. The heater coil 106 may spiral around the electron beam separator 100. The first separator coil pair 104 and the second separator coil pair 105 are illustrated as being inside another component, but also may be exposed on both ends.

Figure 3:
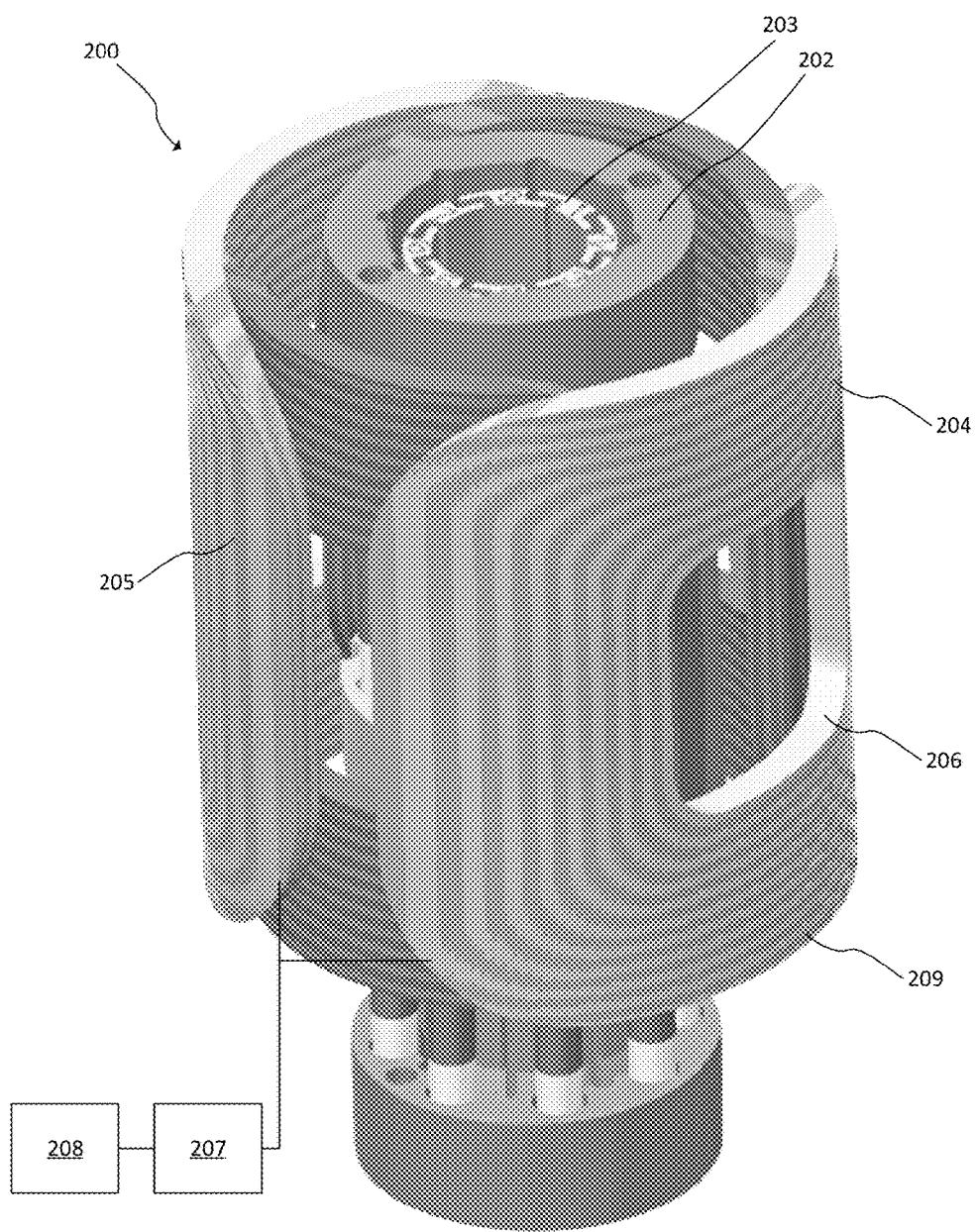
FIG. 3 is a perspective view of a second embodiment of an electron beam separator in accordance with the present disclosure.

FIG. 3 is a perspective view of a second embodiment of an electron beam separator 200. The electron beam separator 200 includes at least one ceramic divider 202. The ceramic divider 202 can hold the first separator coil pair 204 and the second separator coil pair 205 in place.

A set of electrostatic plates 203 in an octupole arrangement (labeled 1-8 in FIG. 3) are disposed on the ceramic divider 202. The ceramic divider 202 can hold the electrostatic plates 203 in place.

A first separator coil pair 204 is disposed around the ceramic divider 202 and arranged on opposite sides of the electron beam separator 200. For example, the first separator coil pair 204 may be bent in place such that a tight fit is provided.

A second separator coil pair 205 is disposed around the ceramic divider 202 and arranged on opposite sides of the electron beam separator 200. The second separator coil pair 205 may be orthogonal to the first separator coil pair 204 and may be wound on the first separator coil pair 204. For example, the second separator coil pair 205 may be bent in place such that a tight fit is provided.

The first separator coil pair 204 and the second separator coil pair 205 are bifilar in this embodiment. Each of the first separator coil pair 204 and the second separator coil pair 205 include a separator coil 209 and a heater coil 206, which are shaded differently in FIG. 3.

By bifilar, the first separator coil pair 204 and the second separator coil pair 205 are closely spaced, parallel windings. The spacing may be determined by the gauge of the windings.

There may be a particular overlap of the four coils used in the first separator coil pair 204 and the second separator coil pair 205. An example of the overlap is shown in FIG. 3.

A curvature of approximately 120° around the electron beam separator 200 may be used. This curvature may be ±0.2°.

A constant power may be applied to the first separator coil pair 204 and the second separator coil pair 205. For example, the power may be applied such that Equations 3-6 are satisfied.

$$I_{u1} = \frac{1}{R_{u1} + R_{u2}}\left[I_{set1} + R_{u2} + \sqrt{(R_{u1} + R_{u2})P - P_{u1}P_{u2}I_{set2}}\right] \qquad \text{Equation 3}$$

$$I_{u2} = I_{set1} - I_{u1} \qquad \text{Equation 4}$$

$$I_{l1} = \frac{1}{R_{l1} + R_{l2}}\left[I_{set2}R_{l2} + \sqrt{(R_{l1} + R_{l2})P - R_{l1}R_{l2}I_{set2}}\right] \qquad \text{Equation 5}$$

$$I_{l2} = I_{set2} - I_{l1} \qquad \text{Equation 6}$$

In Equations 3-6, P is the power required, $R_{u1}$ is the resistance of the first coil in 204, $R_{u2}$ is the resistance of the second coil in 204, $R_{l1}$ is the resistance of the first coil in 205, $R_{l2}$ is the resistance of the second coil in 205, $I_{u1}$ is the current of the first coil in 204, $I_{u2}$ is the current of the second coil in 204, Iii is the current of the first coil in 205, 112 is the current of the second coil in 205, $L_{set1}$ is the set current in 204, and $L_{set2}$ is the set current in 205.

A power source 207 is configured to provide a heater coil current to the heater coils 206 of the first separator coil pair 204 and the second separator coil pair 205. The power source 207 can be configured to provide a desired output ±0.6 A.

A processor 208 also can be included. The processor 108 can be configured to determine a power for the power source 207. For example, the processor 208 can be configured to determine the heater coil current to the first separator coil pair 204 and the second separator coil pair 205 based on Equations 1 and 2.

In the embodiment of FIG. 3, the currents flowing in each of the first separator coil pair 204 and the second separator coil pair 205 are computed from a constant power equation which considers the desired power required and resistances of each coil in the bifilar winding.

While described with respect to an electron beam, the electron beam separator 100 and electron beam separator 200 also can be used as ion beam separators.

Figure 4:
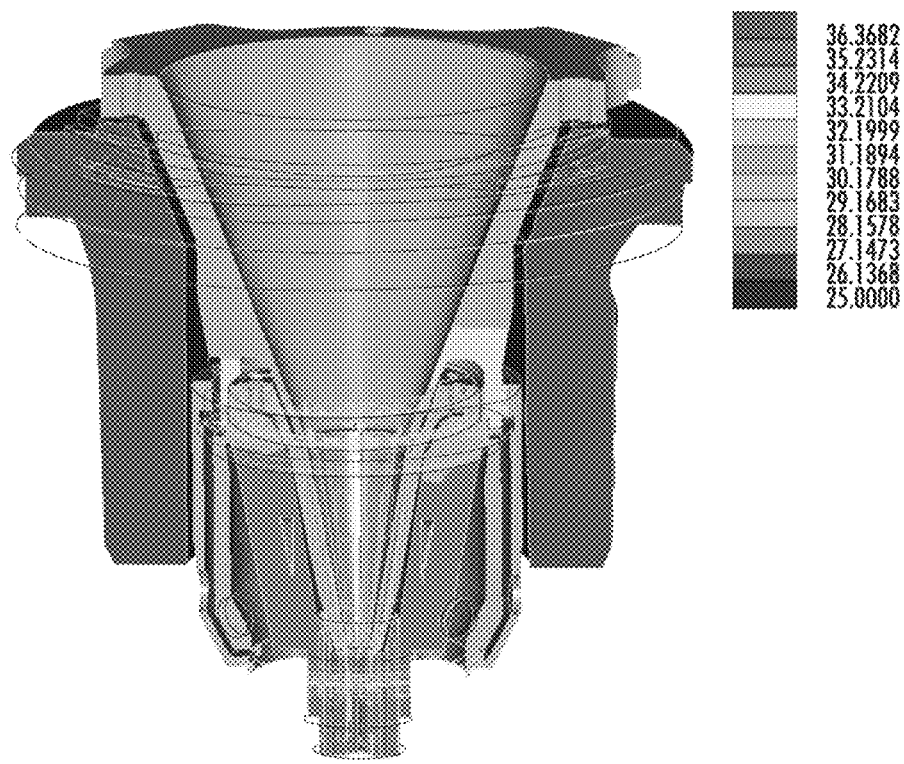
FIG. 4 is a thermal simulation of the first embodiment of the electron beam separator.
Figure 5:
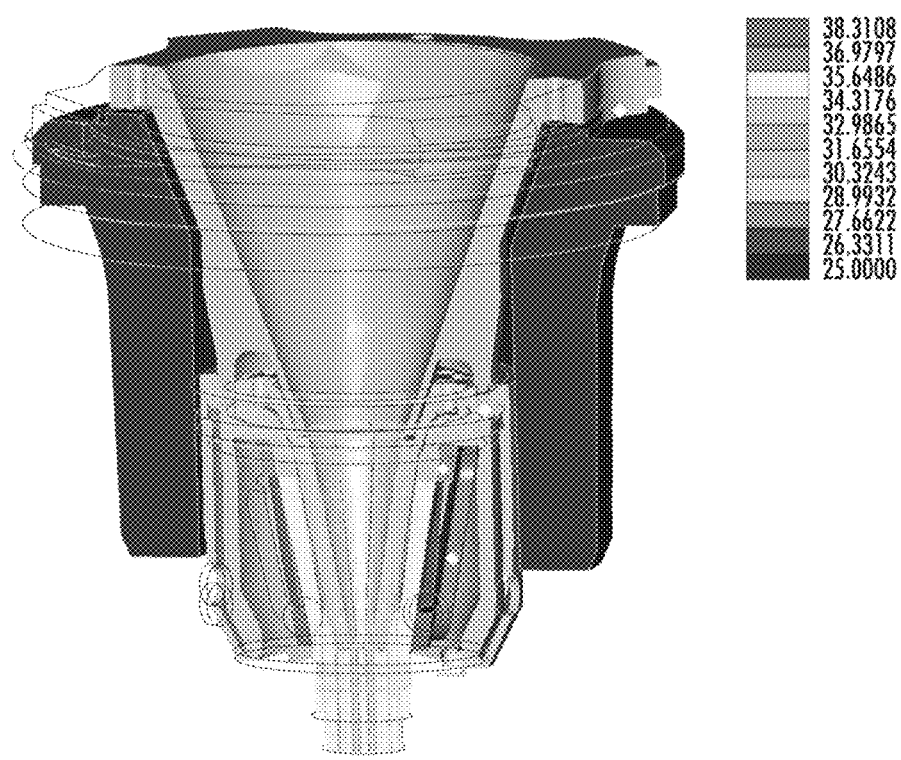
FIG. 5 is a thermal simulation of the second embodiment of the electron beam separator.
Figure 6A:
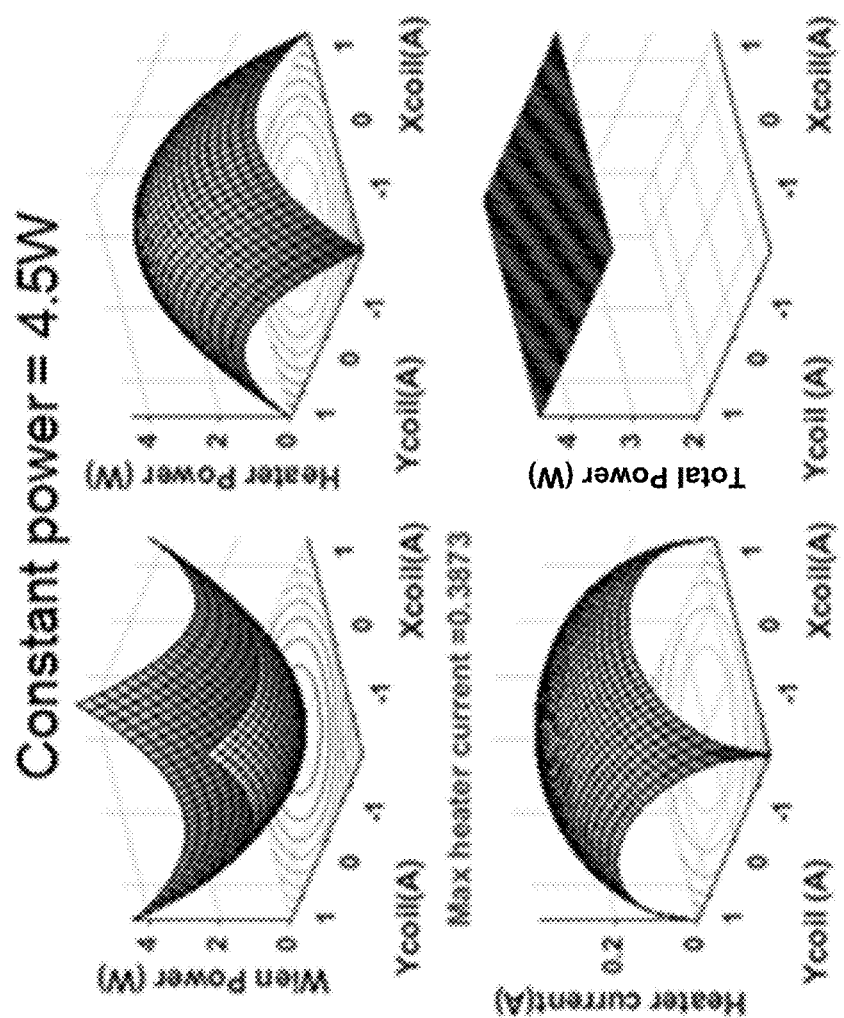
FIGS. 6(a)-6(d) include a series of charts illustrating Wien power and corresponding heater current.
Figure 6B:
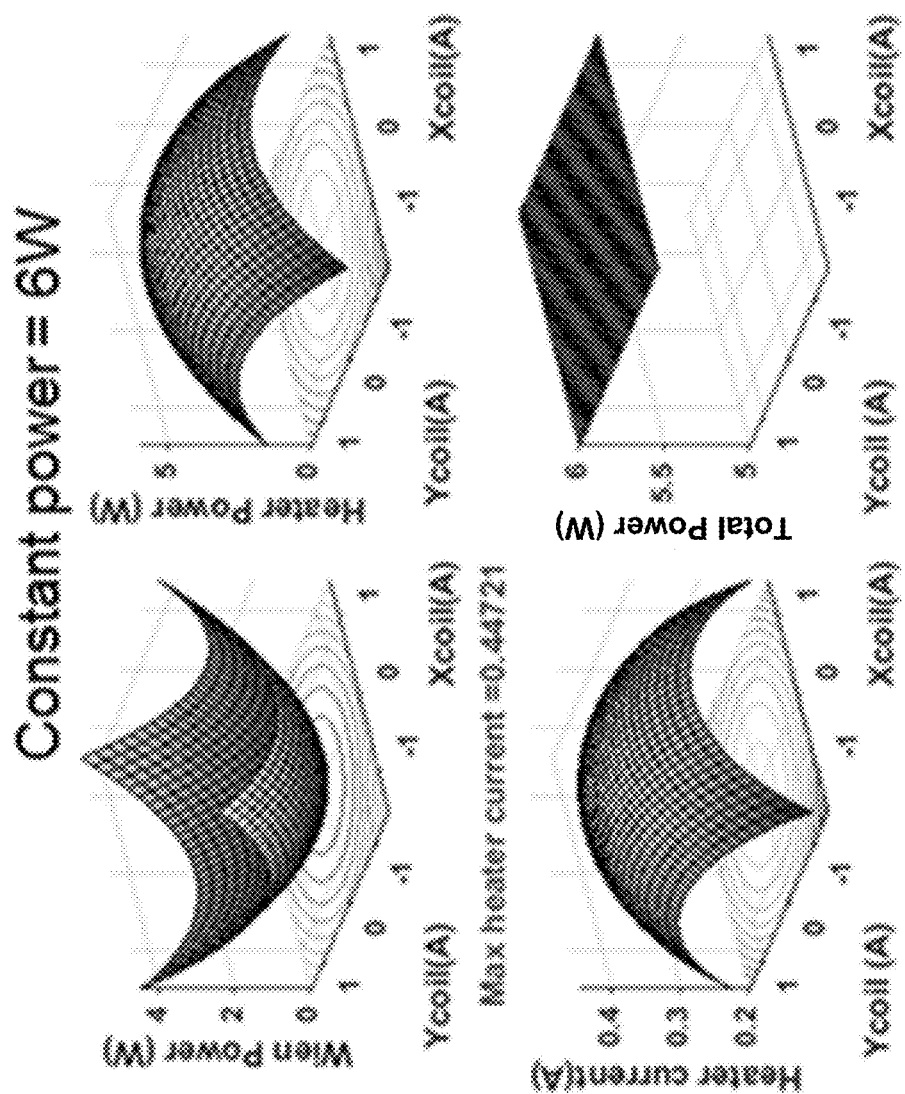
Figure 6C:
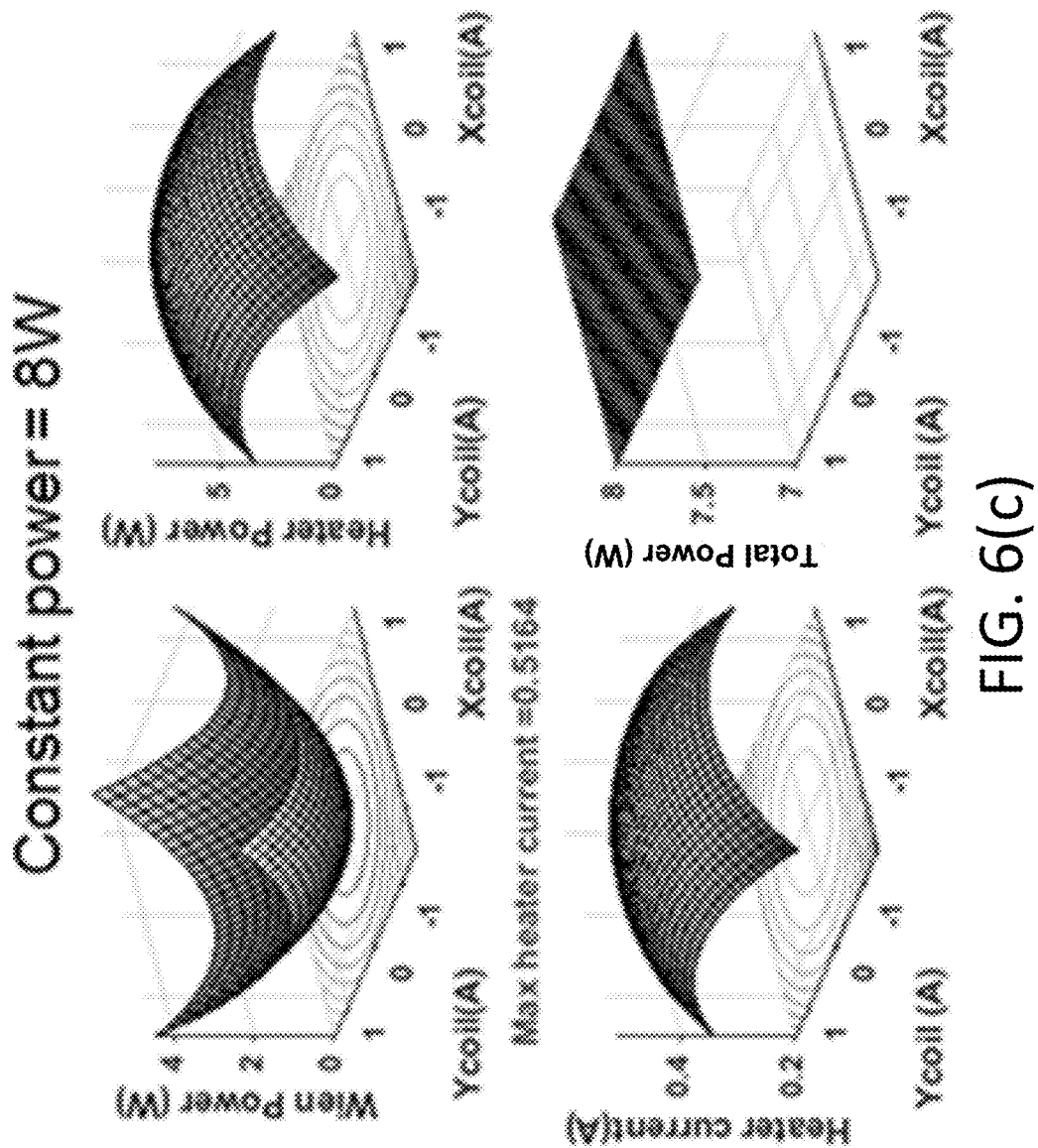
Figure 6D:
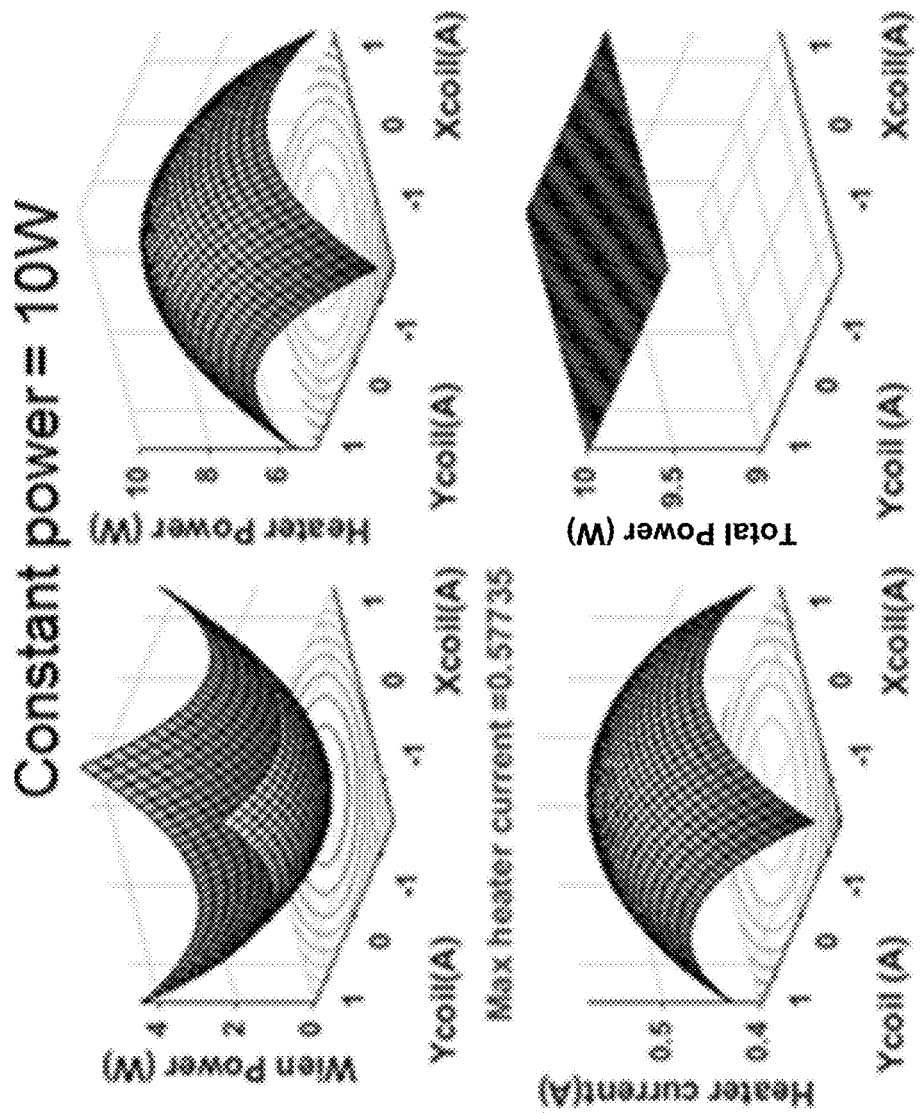

FIG. 4 is a thermal equilibrium simulation of the electron beam separator 100 of FIG. 1 or FIG. 2. In the thermal equilibrium simulation of FIG. 4, a potted coil with the heater coil was used at an operating power of 2 W. FIG. 5 is a thermal equilibrium simulation of the electron beam separator 200 of FIG. 3. The various shadings in the legend represent temperatures. In the thermal equilibrium simulation of FIG. 5, an operating power of 2 W was used with the bifilar coil. In both FIGS. 4 and 5, steady state thermal condition is reached during normal operation. No residual beam deflection occurred in these simulations.

FIGS. 6(a)-6(d) include a series of charts illustrating Wien power and corresponding heater current. In these examples, $I_x$ equals $I_y$, which is ±1.5 A. $R_x$ equals $R_y$, which is 1 Ohm. The $R_{heater}$ coil is 30 Ohm. Based on the results, constant power is maintained across all combination of currents.

Figure 7:
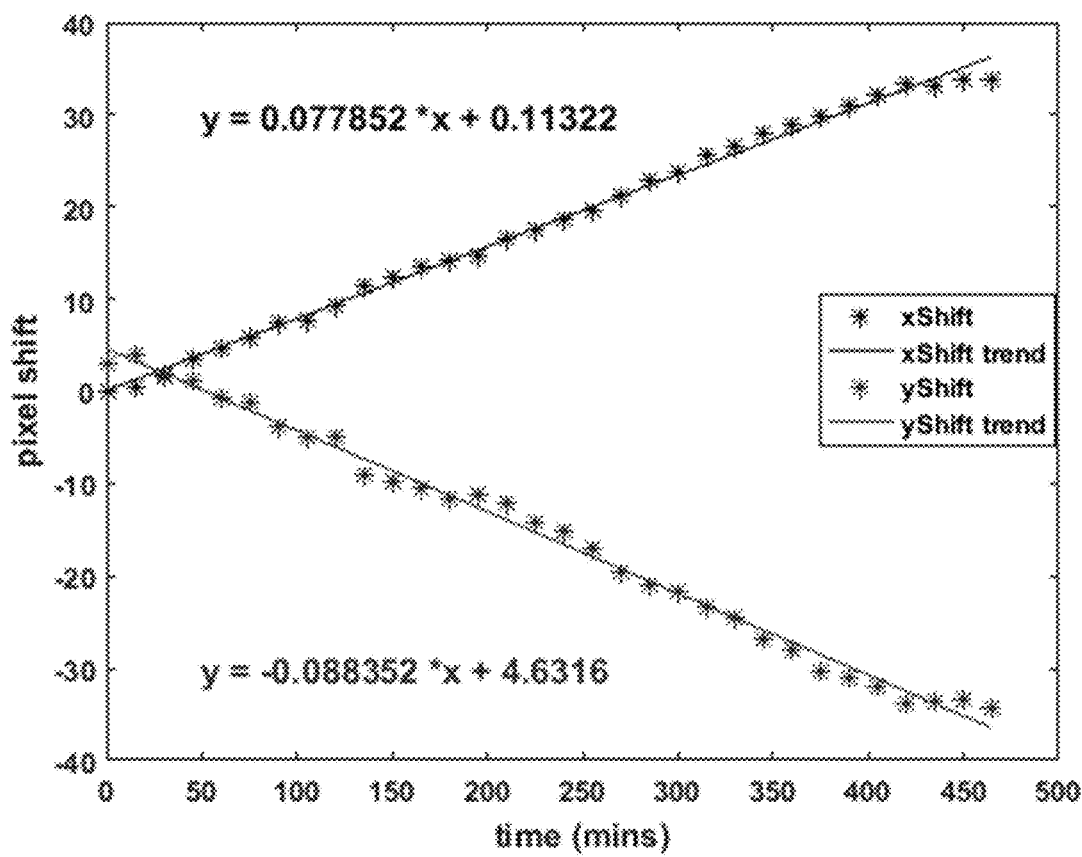
FIG. 7 is a chart showing pixel shift over time for the first embodiment of the beam separator with the high current off.
Figure 8:
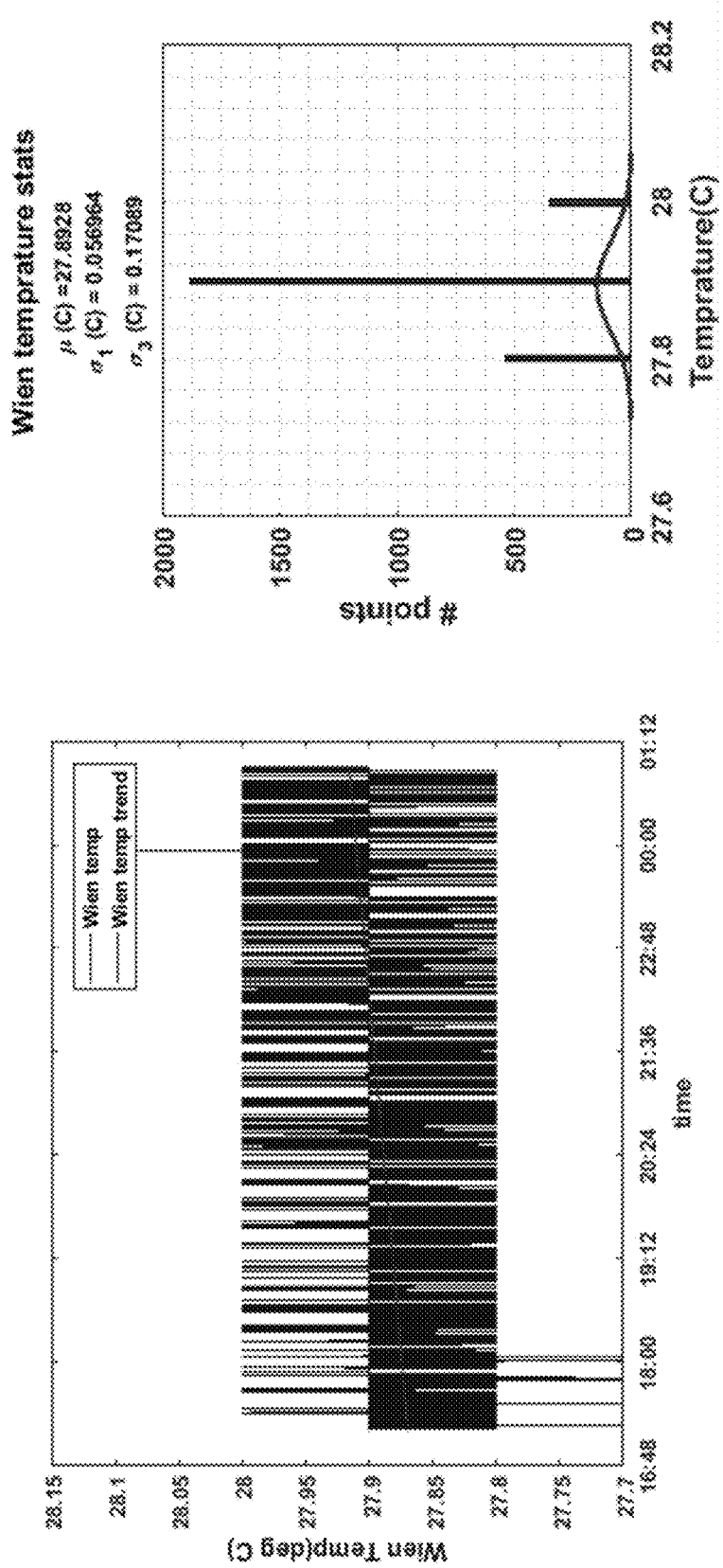
FIG. 8 shows a chart of the Wien temperature and Wien temperature statistics for the first embodiment of the electron beam separator with high current off.
Figure 9:
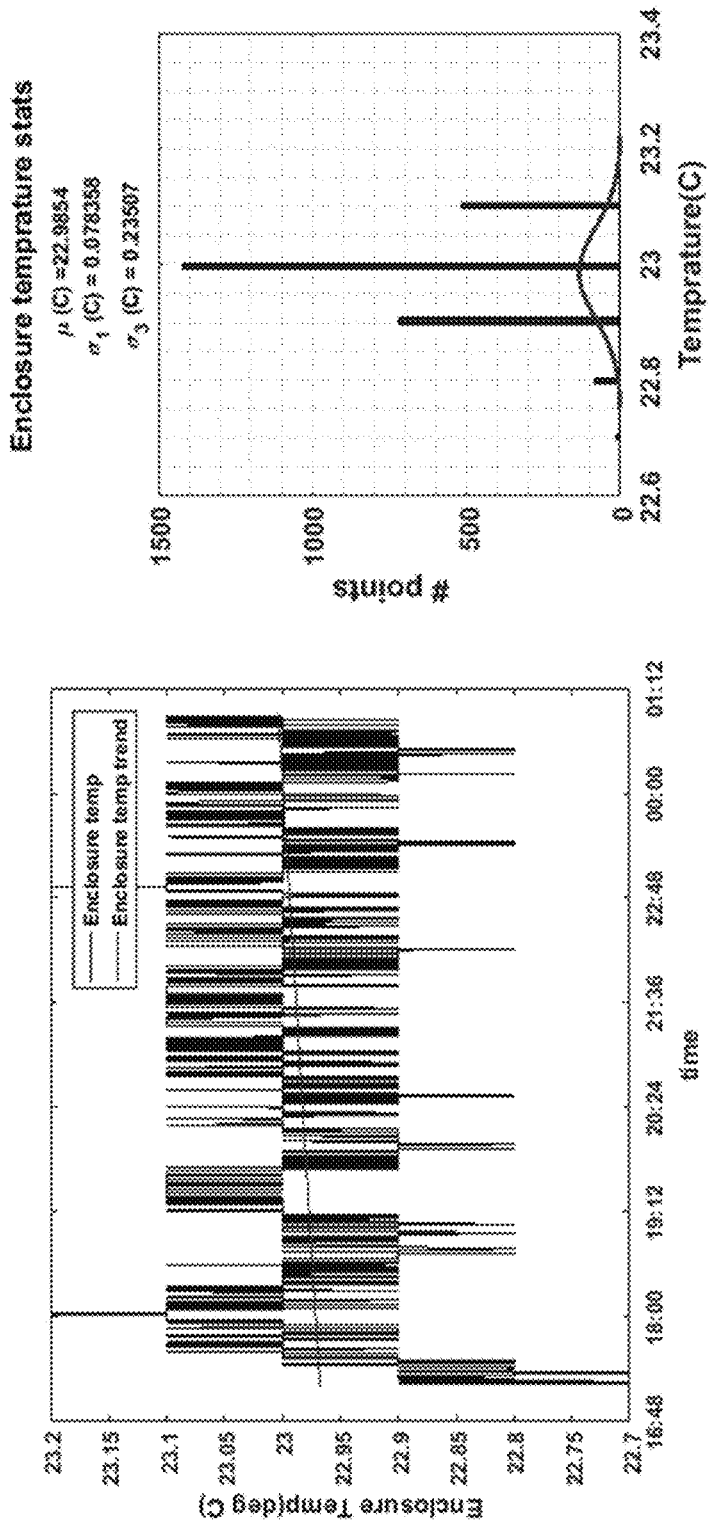
FIG. 9 shows a chart of enclosure temperature and the enclosure temperature statistics for the first embodiment of the electron beam separator with high current off.

FIG. 7 is a chart showing pixel shift over time for the first embodiment of the beam separator with the high current off. FIG. 8 shows a chart of the Wien temperature and Wien temperature statistics for the first embodiment of the beam separator with high current off. FIG. 9 shows a chart of enclosure temperature and the enclosure temperature statistics for the first embodiment of the beam separator with high current off.

Figure 10:
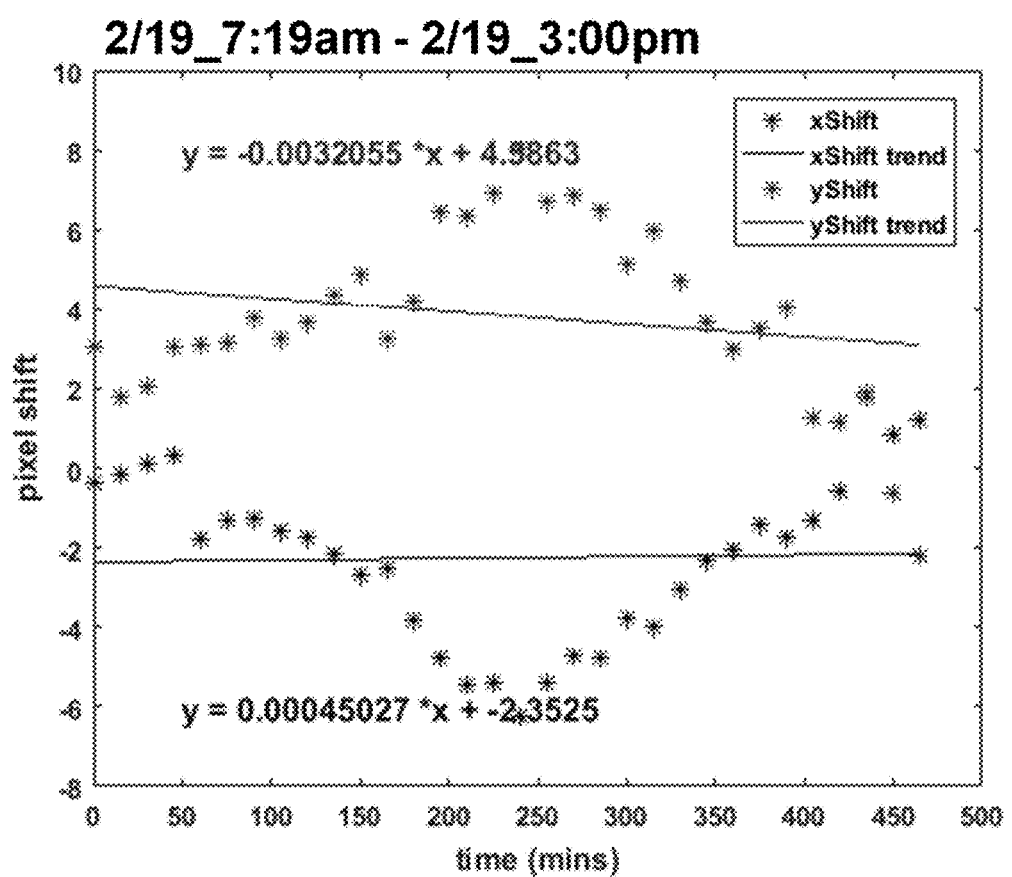
Figure 11:
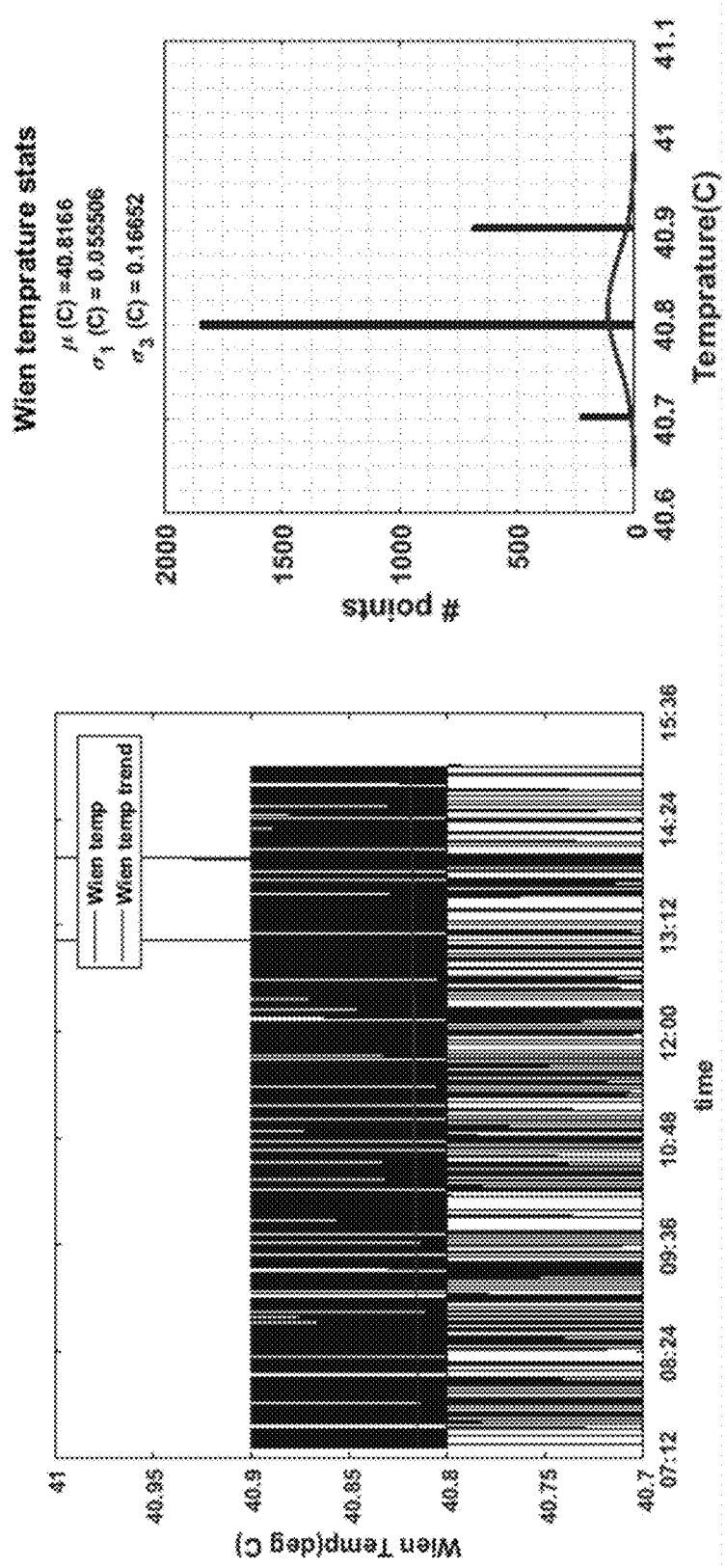
Figure 12:
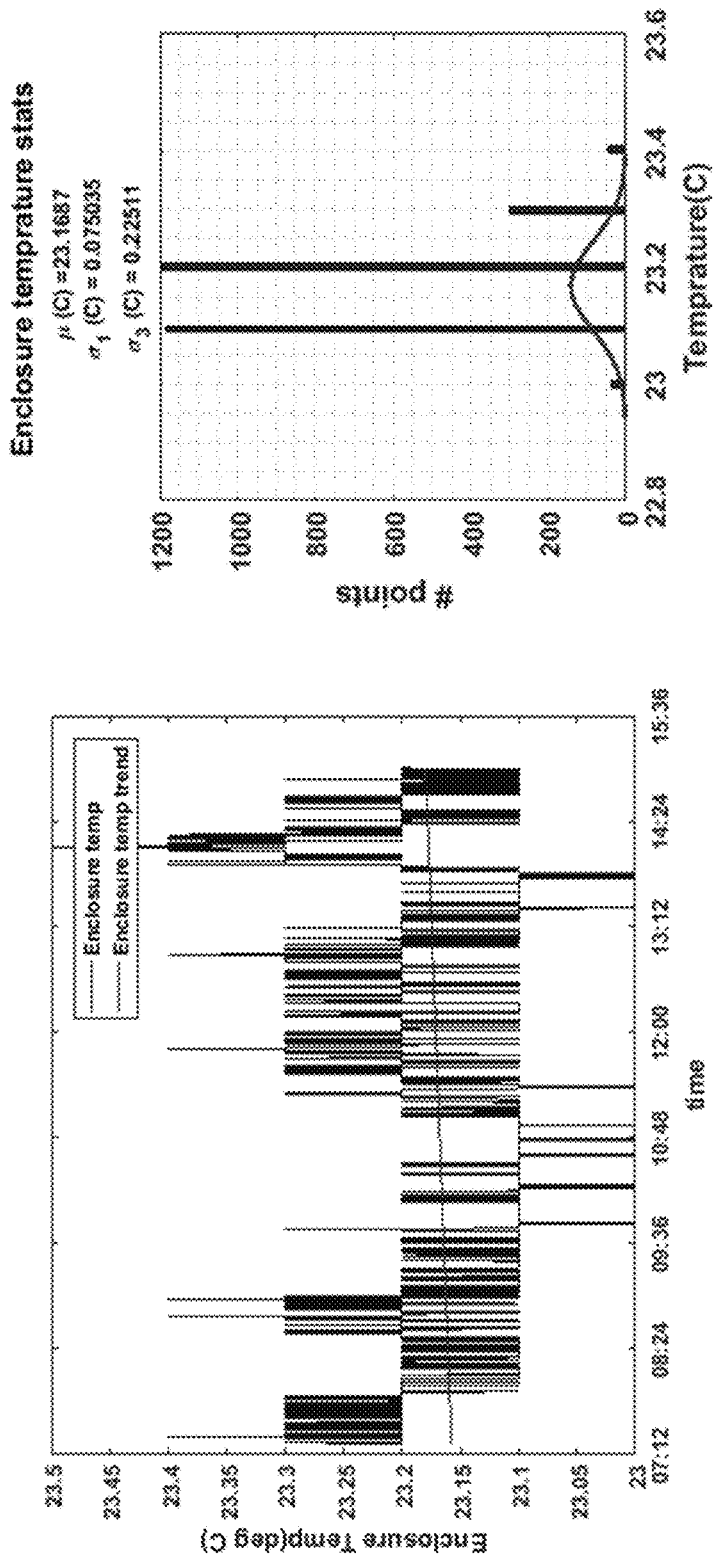

FIG. 10 is a chart showing pixel shift over time for the first embodiment of the beam separator with the high current on. FIG. 11 shows a chart of the Wien temperature and Wien temperature statistics for the first embodiment of the beam separator with high current on. FIG. 12 shows a chart of enclosure temperature and the enclosure temperature statistics for the first embodiment of the beam separator with high current on.

The impact of heater coil is shown in FIGS. 7-12. A reduction in beam drift is observed. These results show a three sigma temperature trend with ±0.25°. The slope of the chart in FIG. 7 and FIG. 10 show the reduction in beam drift.

FIG. 13 shows thermally-induced drift prior to correction. FIG. 14 shows thermally-induced drift correction. The drift correction can be performed as described with respect to FIG. 1. In the examples of FIGS. 13 and 14, the target power was 4 W, $R_x$ was 1 Ohm, $R_y$ was 1 Ohm, and $R_{heater}$ was 30 Ohm.

FIG. 15 is a chart of heater coil zero deflection condition. These results, combined with those of FIGS. 13 and 14, demonstrate that heated-related deflection can be compensated for with minimal impact to constant power.

In an instance, the method used in FIGS. 13-15 included setting the electron beam separator to an optimal setting. Heater coil current is determined based on a constant power equation and applied. Beam deflection is measured. Separator coil versus heater coil is plotted. A zero deflection condition slope is extracted. The beam separator coil current is then adjusted based on the slope in the appropriate direction.

Figure 16:
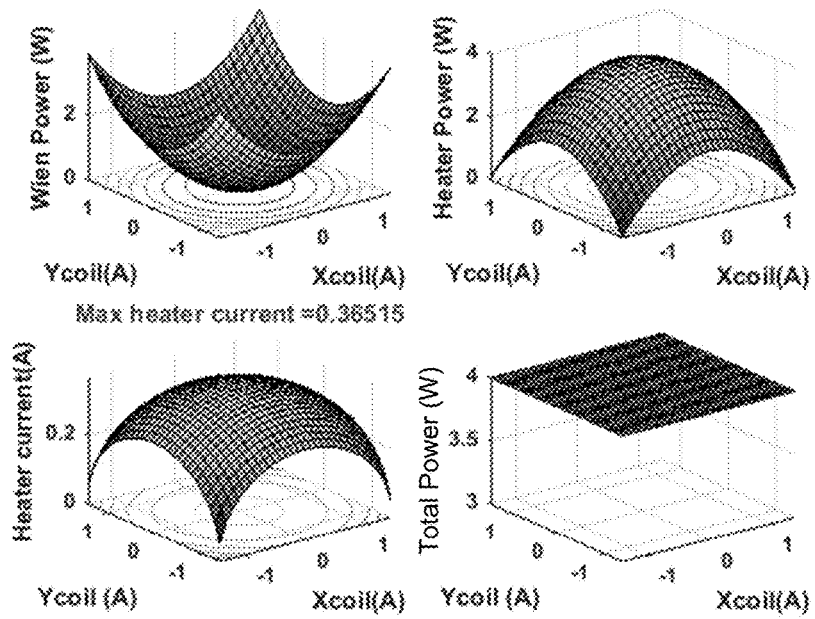
FIG. 16 is a chart of impact on constant power due to correction with a theoretical ideal condition.
Figure 17:
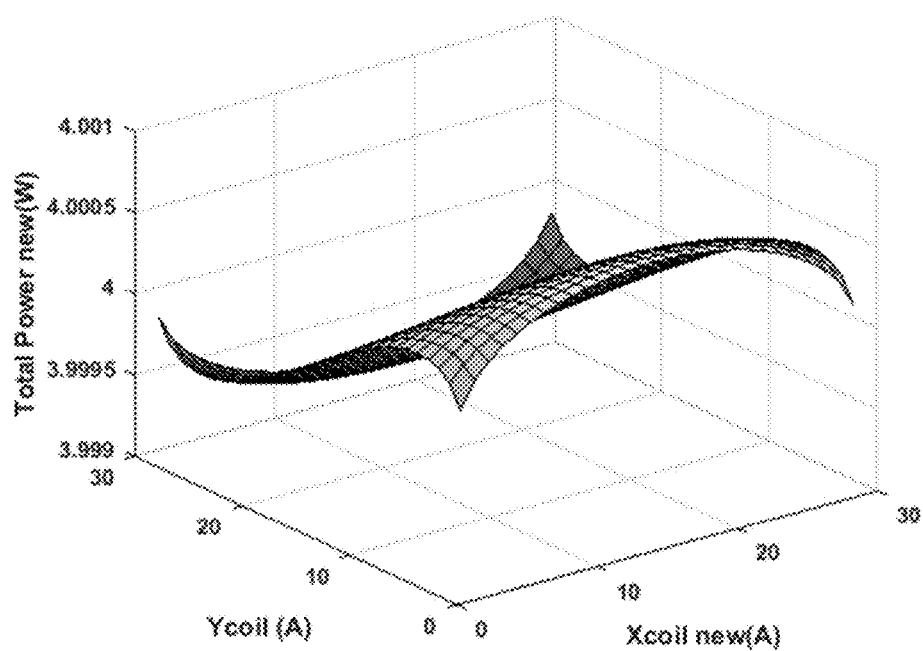
FIG. 17 is a chart of impact on constant power due to correction with new total power condition after correction.
Figure 18:
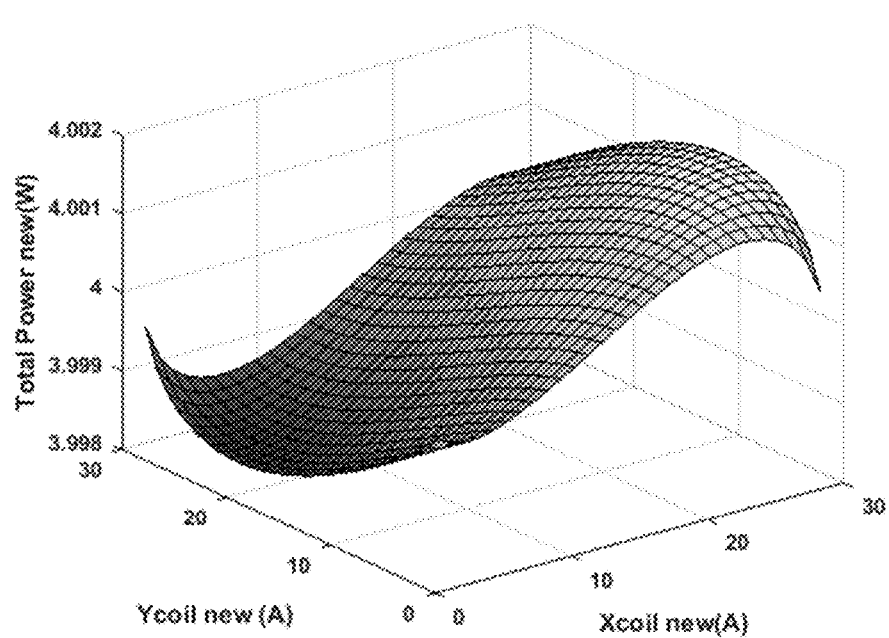
FIG. 18 is a chart of impact on constant power due to correction in a hypothetical instance where both the X and Y coils are used to compensate for deflection.

FIG. 16 is a chart of impact on constant power due to correction with a theoretical ideal condition. FIG. 17 is a chart of impact on constant power due to correction with new total power condition after correction. FIG. 18 is a chart of impact on constant power due to correction in a hypothetical instance where both the X and Y coils are used to compensate for deflection. As seen in FIGS. 16-18, compensation heater coil small deflections using the x or y coils has minimal impact on constant power condition.

Figure 19:
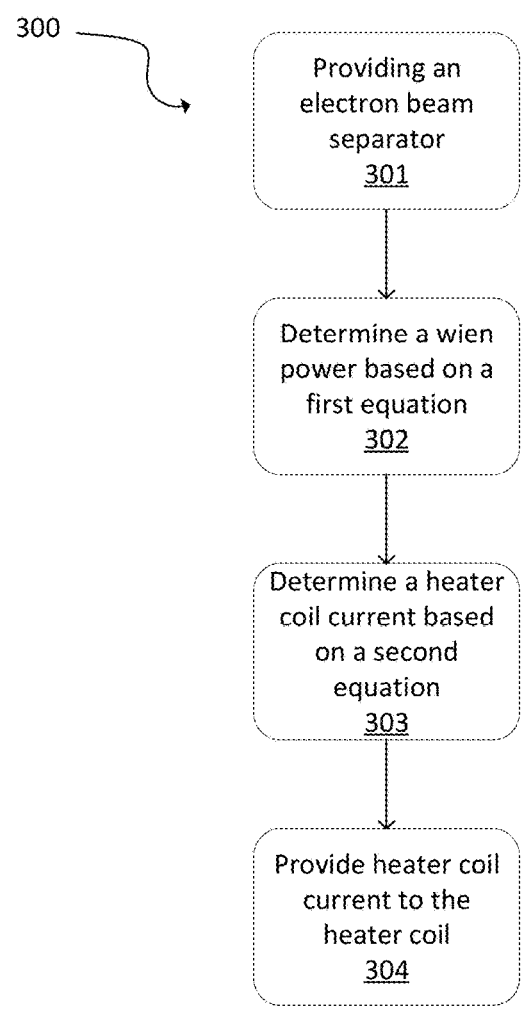
FIG. 19 is an embodiment of a method in accordance with the present disclosure.

FIG. 19 is an embodiment of a method 300 to reduce thermal induced beam drift in an electron beam. An electron beam separator is provided at 301. The electron beam separator can include a ceramic divider disposed on an electron beam apparatus; a set of electrostatic plates in an octupole arrangement disposed on the ceramic divider; a first separator coil pair disposed around the ceramic divider and arranged on opposite sides of the electron beam separator; a second separator coil pair disposed around the ceramic divider and arranged on opposite sides of the electron beam separator, orthogonal to the first separator coil pair; a heater coil disposed around the electron beam separator; and a power source configured to provide a heater coil current.

Wien power is determined at 302, such as using a processor. This can use Equation 1.

Heater coil current is determined at 303, such as using the processor. This can use Equation 2.

The heater coil current is provided to the heater coil via the power source at 304.

The heater coil current can create a magnetic field that causes a beam deflection. In this instance, the beam deflection can be measured, such as using the processor. The electron beam separator can be calibrated using the processor based on the beam deflection.

Figure 20:
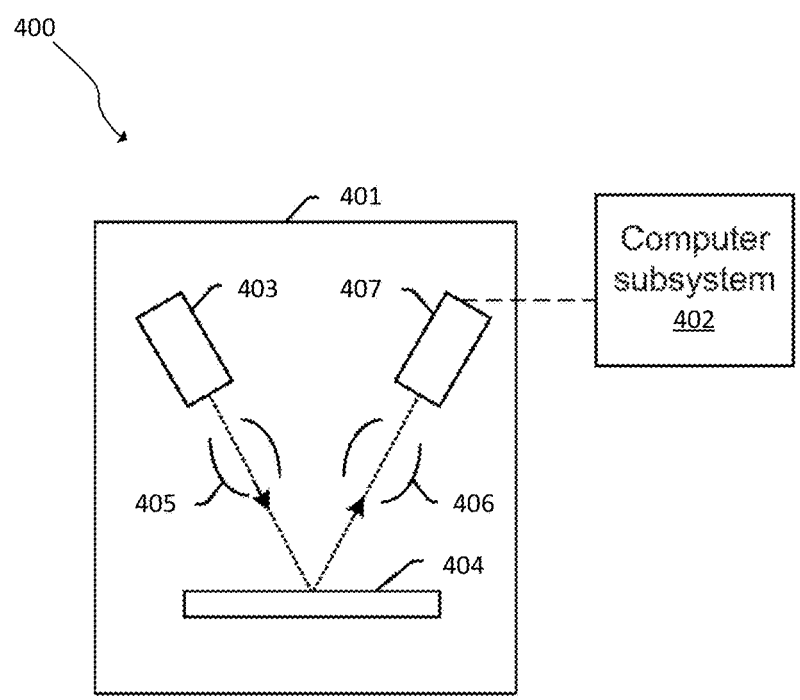
FIG. 20 is a schematic diagram illustrating a side view of an embodiment of a system configured as described herein.

FIG. 20 is a schematic diagram illustrating a side view of an embodiment of a system. The imaging system 400 may be an electron beam based imaging system. In this manner, in some embodiments, the input images are generated by an electron beam based imaging system. The imaging system 400 includes electron column 401 coupled to computer subsystem 402. As also shown in FIG. 20, the electron column 401 includes electron beam source 403 configured to generate electrons that are focused to specimen 404 by one or more elements 405. In one embodiment, the specimen 404 is a wafer. The wafer may include any wafer known in the art. In another embodiment, the specimen 404 is a reticle. The reticle may include any reticle known in the art.

The electron beam source 403 may include, for example, a cathode source or emitter tip, and one or more elements 405 may include, for example, a gun lens, an anode, a beam limiting aperture, a gate valve, a beam current selection aperture, an objective lens, and a scanning subsystem, all of which may include any such suitable elements known in the art.

Electrons returned from the specimen 404 (e.g., secondary electrons) may be focused by one or more elements 406 to detector 407. One or more elements 406 may include, for example, a scanning subsystem, which may be the same scanning subsystem included in element(s) 405.

The electron column 401 may include any other suitable elements known in the art, including the electron beam separator 100 or electron beam separator 200.

Although the electron column 401 is shown in FIG. 20 as being configured such that the electrons are directed to the specimen 404 at an oblique angle of incidence and are scattered from the specimen 404 at another oblique angle, the electron beam may be directed to and scattered from the specimen 404 at any suitable angles. In addition, the electron beam based imaging system 400 may be configured to use multiple modes to generate images of the specimen 404 (e.g., with different illumination angles, collection angles, etc.). The multiple modes of the electron beam based imaging system 400 may be different in any image generation parameters of the imaging system.

Computer subsystem 402 may be coupled to detector 407 in any suitable manner (e.g., via one or more transmission media, which may include wired and/or wireless transmission media) such that the computer subsystem 402 can receive the output generated by the detector 407 during scanning of the specimen 404. Computer subsystem 402 may be configured to perform a number of functions using the output of the detector 407. The detector 407 may detect electrons returned from the surface of the specimen 404 thereby forming electron beam images of the specimen 404. The electron beam images may include any suitable electron beam images. Computer subsystem 402 may be configured to perform one or more functions for the specimen 404 using output generated by detector 407.

The computer subsystem 402 shown in FIG. 20 may take various forms, including a personal computer system, image computer, mainframe computer system, workstation, network appliance, internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the imaging system 400 includes more than one computer subsystem 402, then the different computer subsystems may be coupled to each other such that images, data, information, instructions, etc. can be sent between the computer subsystems. Two or more of such computer subsystems may also be effectively coupled by a shared computer-readable storage medium (not shown).

It is noted that FIG. 20 is provided herein to generally illustrate a configuration of an electron beam based imaging system 400 that may be included in the embodiments described herein. The electron beam based imaging system 400 configuration described herein may be altered to optimize the performance of the imaging system as is normally performed when designing a commercial imaging system. In addition, the systems described herein may be implemented using an existing system (e.g., by adding functionality described herein to an existing system). For some such systems, the embodiments described herein may be provided as optional functionality of the system (e.g., in addition to other functionality of the system).

The electron beam based imaging system 400 also may be configured as an ion beam based imaging system. Such an imaging system may be configured as shown in FIG. 20 except that the electron beam source 403 may be replaced with any suitable ion beam source known in the art. In addition, the imaging system may be any other suitable ion beam based imaging system such as those included in commercially available focused ion beam (FIB) systems, helium ion microscopy (HIM) systems, and secondary ion mass spectroscopy (SIMS) systems.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
an electron beam separator;
a ceramic divider disposed on the electron beam separator;
a set of electrostatic plates in an octupole arrangement disposed on the ceramic divider;
a first separator coil pair disposed around the ceramic divider and arranged on opposite sides of the electron beam separator;
a second separator coil pair disposed around the ceramic divider and arranged on opposite sides of the electron beam separator, orthogonal to the first separator coil pair;
a heater coil disposed around the electron beam separator; and
a power source configured to provide a heater coil current to the heater coil.

2. The apparatus of claim 1, further comprising a processor, and wherein the processor is configured to:
determine a Wien power based on a first equation:

$$P_{wien}=I_x^2 R_x + I_y^2 R_y;$$

wherein $P_{wien}$ is the Wien power, $I_x$ is the current of the first separator coil pair, $R_x$ is the resistance of the first separator coil pair, $I_y$ is the current of the second separator coil pair, and $R_y$ is the resistance of the second separator coil pair; and
determine the heater coil current based on a second equation:

$$I_{heater} = \sqrt{\frac{P - P_{wien}}{R_{heater}}};$$

wherein $I_{heater}$ is the heater coil current, P is the target power, $P_{wien}$ is the Wien power, and $R_{heater}$ is the resistance of the heater coil.

3. The apparatus of claim 2, wherein the heater coil current creates a magnetic field that causes a beam deflection, and the processor is further configured to:
measure the beam deflection; and
calibrate the electron beam separator based on the beam deflection.

4. The apparatus of claim 1, wherein the heater coil is nichrome.

5. The apparatus of claim 1, wherein the heater coil is copper.

6. The apparatus of claim 1, wherein a winding pitch of the heater coil is from 8 to 10 turns per inch.

7. The apparatus of claim 1, wherein the heater coil is a 24 gauge wire.

8. An apparatus comprising:
an electron beam separator;
a ceramic divider disposed on the electron beam separator;
a set of electrostatic plates in an octupole arrangement disposed on the ceramic divider;
a first separator coil pair disposed around the ceramic divider and arranged on opposite sides of the electron beam separator;
a second separator coil pair disposed around the ceramic divider and arranged on opposite sides of the electron beam separator, orthogonal to the first separator coil pair; and
a power source configured to provide a heater coil current;
wherein the first separator coil pair and the second separator coil pair are bifilar, each comprising a separator coil and a heater coil; and wherein the heater coil current is provided to the heater coils of the first separator coil pair and the second separator coil pair.

9. The apparatus of claim 8, further comprising a processor, and wherein the processor is configured to determine a current provided by the power source.

10. The apparatus of claim 8, wherein a curvature of the first separator coil and the second separator coil is 120°.

11. A method of reducing thermal induced beam drift in an electron beam comprising:
   providing an electron beam separator comprising:
      a ceramic divider disposed on an electron beam apparatus;
      a set of electrostatic plates in an octupole arrangement disposed on the ceramic divider;
      a first separator coil pair disposed around the ceramic divider and arranged on opposite sides of the electron beam separator;
      a second separator coil pair disposed around the ceramic divider and arranged on opposite sides of the electron beam separator, orthogonal to the first separator coil pair;
      a heater coil disposed around the electron beam separator; and
      a power source configured to provide a heater coil current;
   determining, using a processor, a wien power based on a first equation:

$$P_{wien} = I_x^2 R_x + I_y^2 R_y;$$

wherein $P_{wien}$ is the Wien power, $I_x$ is the current of the first separator coil pair, $R_x$ is the resistance of the first separator coil pair, $I_y$ is the current of the second separator coil pair, and $R_y$ is the resistance of the second separator coil pair; and
   determining, using the processor, a heater coil current based on a second equation:

$$I_{heater} = \sqrt{\frac{P - P_{wien}}{R_{heater}}};$$

wherein $I_{heater}$ is the heater coil current, P is the target power, $P_{wien}$ is the Wien power, and $R_{heater}$ is the resistance of the heater coil; and
   providing the heater coil current to the heater coil via the power source.

12. The method to claim 11, wherein the heater coil current creates a magnetic field that causes a beam deflection, and the method further comprises:
   measuring the beam deflection using the processor; and
   calibrating the electron beam separator using the processor based on the beam deflection.

13. The method to claim 11, wherein deflection correction is determined, and wherein determining the deflection correction includes:
   determining heater coil current based on a constant power equation;
   applying the heater coil current;
   measuring beam deflection;
   determining a zero deflection condition slope; and
   adjusting a coil current to the electron beam separator based on the zero deflection condition slope.

* * * * *